(12) United States Patent
Gagnon et al.

(10) Patent No.: US 7,152,084 B2
(45) Date of Patent: Dec. 19, 2006

(54) PARALLELIZED INFINITE IMPULSE RESPONSE (IIR) AND INTEGRATOR FILTERS

(75) Inventors: François Gagnon, Lachine (CA); Claude Thibeault, Brossard (CA); Jean Belzile, Lachine (CA)

(73) Assignee: Socovar, s.e.c., Montreal (CA)

( * ) Notice: Subject to any disclaimer, the term of this patent is extended or adjusted under 35 U.S.C. 154(b) by 708 days.

(21) Appl. No.: 10/290,484

(22) Filed: Nov. 8, 2002

(65) Prior Publication Data

US 2004/0093366 A1  May 13, 2004

(51) Int. Cl.
*G06F 17/10* (2006.01)
(52) U.S. Cl. .................. 708/301; 708/300
(58) Field of Classification Search ......... 708/300–323
See application file for complete search history.

(56) References Cited

U.S. PATENT DOCUMENTS 4,972,356 A * 11/1990 Williams ............... 708/313
5,790,440 A * 8/1998 Fujii et al. ............. 708/322
6,108,680 A * 8/2000 Liu et al. ............... 708/317
6,263,354 B1 * 7/2001 Gandhi .................. 708/320
6,408,031 B1 * 6/2002 Hendricks .............. 708/307
6,678,709 B1 * 1/2004 Gandhi et al. .......... 708/319
6,870,879 B1 * 3/2005 Gazsi et al. ............ 708/313

* cited by examiner

*Primary Examiner*—Kakali Chaki
*Assistant Examiner*—Chat C. Do
(74) *Attorney, Agent, or Firm*—BCF LLP; Gaétan Prince

(57) ABSTRACT

A digital parallelized Infinite Impulse Response (IIR) integrator filter comprising a first channel having a first input and second channel having a second input, a first adder to add the two channel inputs, an integrator to integrate the added channel inputs to provide a first channel output is described herein. The second input channel is adjacent in time to the first channel input. The second channel further comprises a second adder which adds the first output with the second channel input in order to produce a second output, adjacent in time with the first output. This configuration can be generalized to n inputs and m outputs.

6 Claims, 11 Drawing Sheets

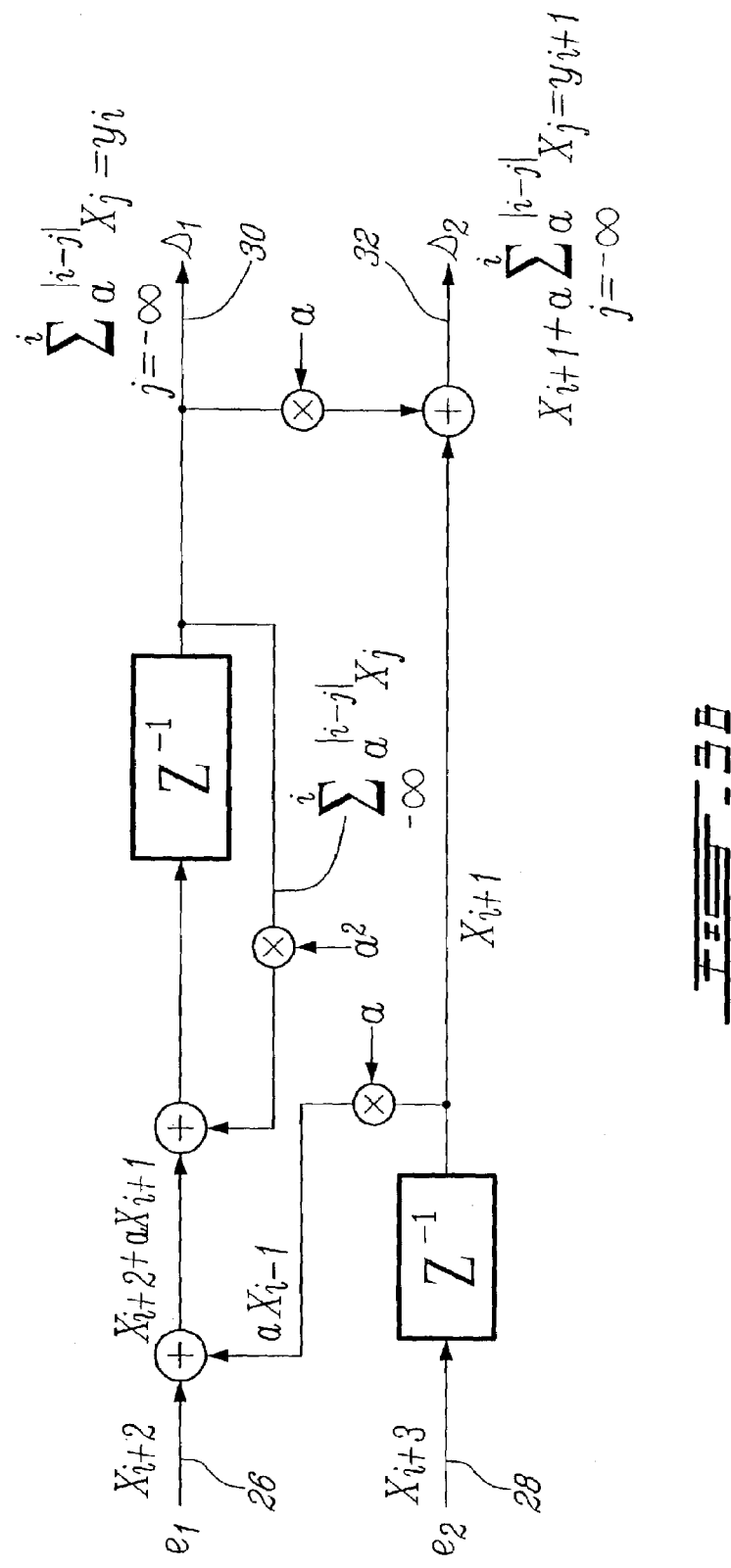

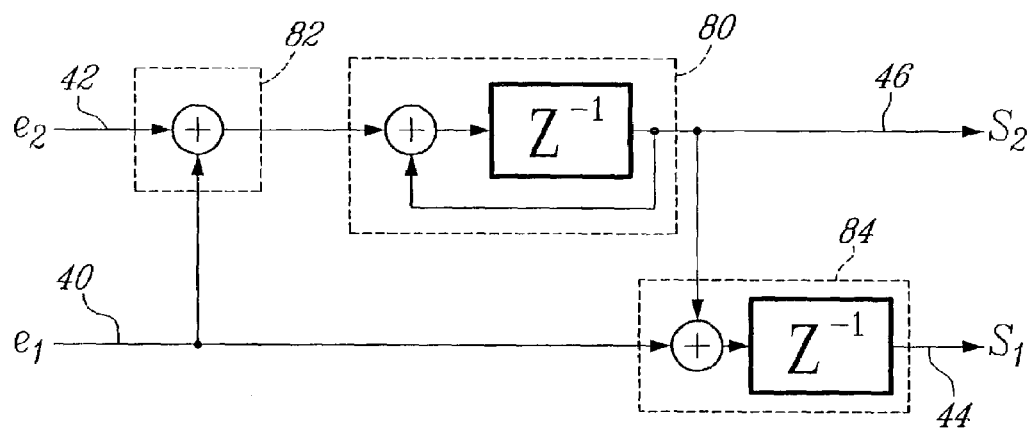
FIG_4A
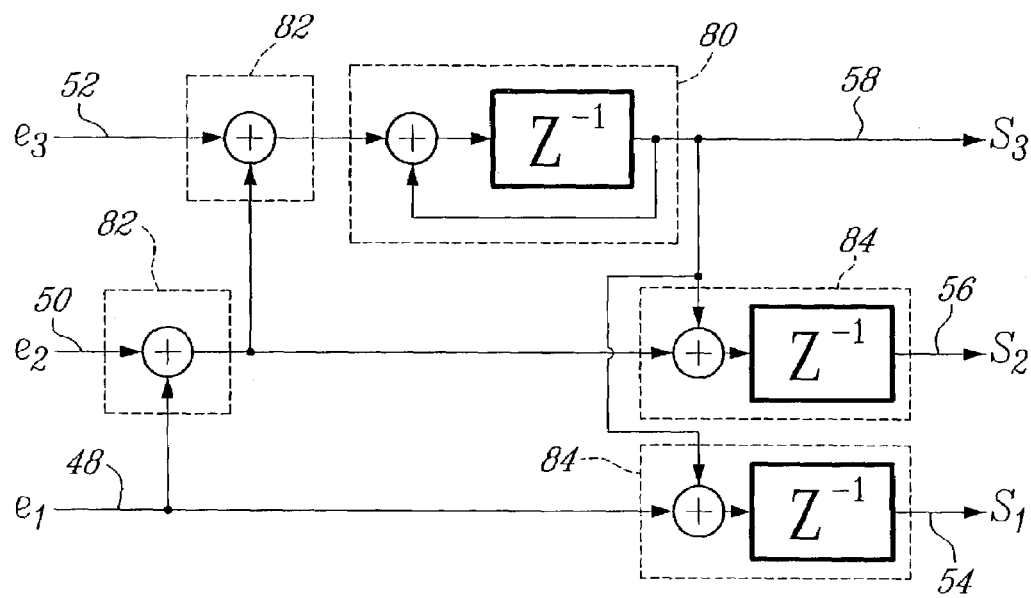
FIG_4B

PARALLELIZED INFINITE IMPULSE RESPONSE (IIR) AND INTEGRATOR FILTERS

TECHNICAL FIELD

This invention pertains to the field of digital filters. More precisely, this invention pertains to the field of Infinite Impulse Response (IIR) filters and to the field of integrator filters.

BACKGROUND OF THE INVENTION

Filters are used to separate wanted signals from unwanted signals. It is therefore obvious to state that they are very important in an electronic design.

In the case of software radio applications, sampling frequencies are much higher than the maximum signal processing speed of programmable devices. The sampled signal needs to be demodulated and decimated efficiently with reasonable complexity.

Use of very high frequency (VHF) allows to digitize signals at RF and thus reduces the number of tunable RF components needed at the receiver. Unfortunately, samples are produced at a speed, which may be much higher than processing speed of the digital components. This is the case in an FPGA designed to operate at 200 MHz and which receives sample signals sampled at 1 GHz. In such example, at least 5 parallel sample streams are required as an input to the filter.

There is a need for a parallelized filter.

SUMMARY OF THE INVENTION

It is an object of the invention to provide a parallelized integrator filter have n inputs and m outputs, wherein n is equal to m.

It is an object of the invention to provide a parallelized integrator filter have n inputs and m outputs, wherein n is larger than m.

It is an object of the invention to provide a parallelized integrator filter have n inputs and m outputs, wherein n is smaller than m.

It is another object of the invention to provide a parallelized infinite impulse response filter having n inputs and m outputs wherein n is equal to m.

It is another object of the invention to provide a parallelized infinite impulse response filter having n inputs and m outputs wherein n is larger than m.

It is another object of the invention to provide a parallelized infinite impulse response filter having n inputs and m outputs wherein n is smaller than m.

According to a first aspect of the invention, there is provided a digital parallelized integrator filter comprising a first channel having a first input receiving a first digital sample signal, comprising a first adding unit adding the received first digital sample signal provided at said first input with a provided second signal to provide an added signal, further comprising an integration unit integrating said added signal to provide a first output signal at a first channel output, a second channel having a second input receiving a second digital sample signal adjacent in time to said first digital sample signal, the second input further providing said second signal, the second channel further comprising a second adding unit adding the first output signal to the second signal to provide a second output signal at a second channel output, and a delaying unit connected to one of the second channel output, if the first digital sample signal is following in time the second digital sample signal, or to the second channel input if the first digital sample signal is preceding in time the second digital sample signal, wherein the first output signal is either, an integrated signal of previous digital sample signals, following in time the second output signal if the delaying unit is connected to the second channel output or, an integrated signal of previous digital sample signals, preceding in time the second output signal if the delaying unit is connected to the second channel input.

According to another aspect of the invention, there is provided a method for providing a digital parallelized integrator filter, the method comprising the steps of providing a first input digital sample signal to a first adding unit, providing a second input digital sample signal, adjacent in time to said first input digital sample signal, if said second input digital sample signal is following in time the first input digital sample signal, delaying the second input digital sample signal and adding the delayed second input digital sample signal to said first input digital sample signal to provide an added signal using an adding unit, if said second input digital sample signal is preceding in time the first input digital sample signal, adding the second input digital sample signal to said first input digital sample signal to provide an added signal using an adding unit, integrating said added signal using an integration unit to provide a first output digital sample signal, if said second input digital sample signal is following in time the first input digital sample signal, adding the delayed second input digital sample signal to the first output digital sample signal to provide a second output digital sample signal, if said second input digital sample signal is preceding in time the first input digital sample signal, adding the second input digital sample signal to the first output digital sample signal to provide a second output digital sample signal and if said second input digital sample signal is preceding in time the first input digital sample signal, delaying the second output digital sample signal to provide the second output digital sample signal, wherein the first output digital sample signal is either, an integrated signal of previous digital sample signals, following in time the second output digital sample signal if the first input digital sample signal is following in time the second input digital sample signal, or an integrated signal of previous digital sample signals, preceding in time the second output digital sample signal if the first input digital sample signal is preceding in time the second input digital sample signal.

BRIEF DESCRIPTION OF THE DRAWINGS

Further features and advantages of the present invention will become apparent from the following detailed description, taken in combination with the appended drawings, in which:

FIG. 3b is a system and signals diagram which shows the second embodiment of the invention; in this embodiment two input signals $x_{i+2}$ and $x_{i+3}$, which are successive in time to input signals $x_i$ and $x_{i+1}$, are provided to a parallelized infinite impulse response filter having a transfer function $y_i/x_i=1/(1-az^{-1})$;

FIG. 4a is a system and signals diagram which shows another embodiment of the invention; in this other embodiment of the invention, an Infinite Impulse Response (IIR) filter which achieves integration is provided having 2 inputs and 2 outputs;

FIG. 4b is a system and signals diagram which shows another embodiment of the invention; in this other embodiment of the invention, an Infinite Impulse Response (IIR) filter which achieves integration is provided having 3 inputs and 3 outputs;

It will be noted that throughout the appended drawings, like features are identified by like reference numerals.

DETAILED DESCRIPTION OF THE PREFERRED EMBODIMENT

Figure 1A:
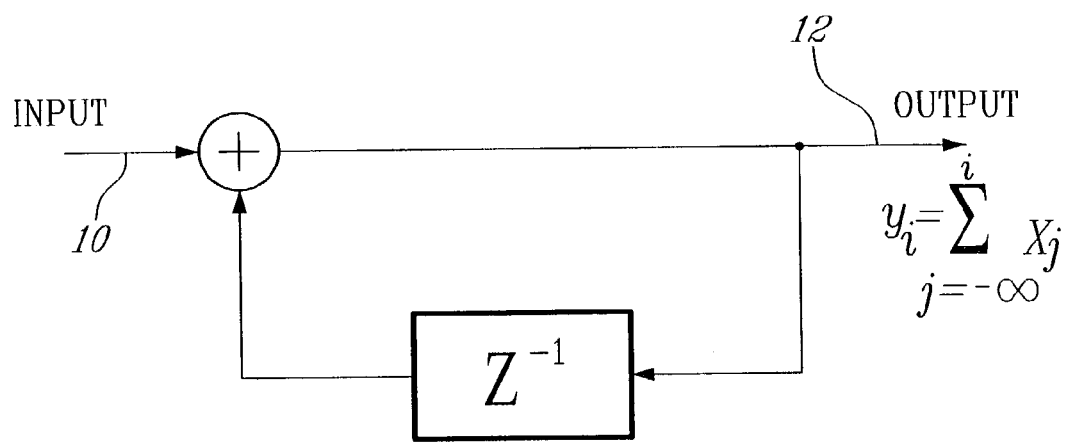
FIG. 1a is a system and signals diagram which shows a prior art embodiment of a first order Infinite Impulse Response (IIR) filter which achieves integration; this embodiment comprises one input and one output.

Now referring to FIG. 1a, there is shown a prior art embodiment of a first order Infinite Impulse Response (IIR) filter.

The filter has one input 10 receiving an input signal $x_i$ and one output 12 providing an output signal $$y_i = \sum_{j=-\infty}^{j=i} x_j.$$

It will be appreciated that successive inputs are provided successively to the input 10 as no parallelizing scheme is implemented. Consequently, successive outputs are timely provided to the output 12.

Figure 1B:
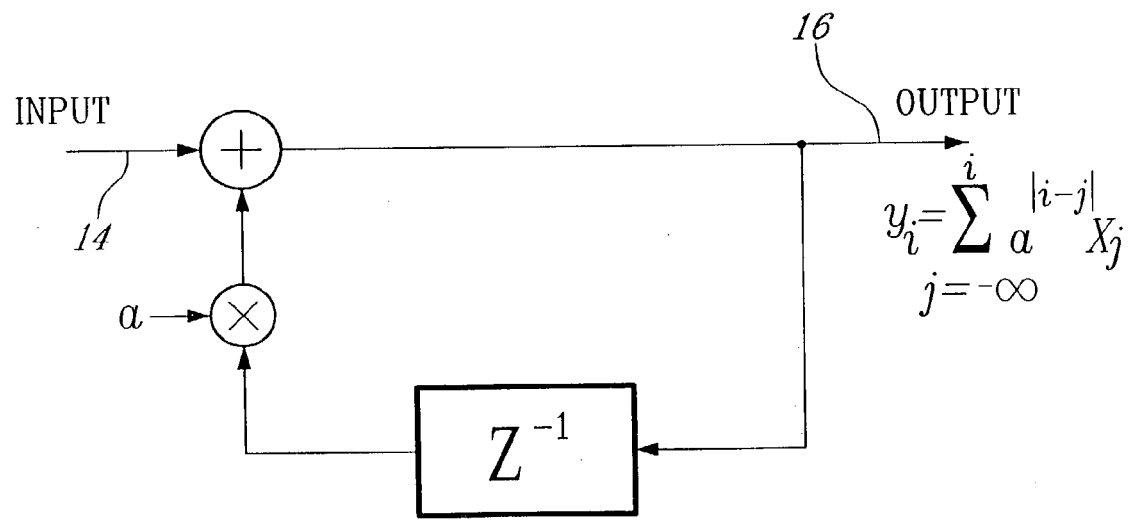
FIG. 1b is a system and signals diagram which shows a prior art embodiment of a second first order Infinite Impulse Response (IIR) filter which achieves an integration coupled with a multiplication; this embodiment comprises one input and one output.

Now referring to FIG. 1b, there is shown another prior art embodiment of a first order Infinite Impulse Response filter.

In this embodiment, the filter has an input 14 receiving an input signal $x_i$ and an output 16 providing an output signal $$y_i = \sum_{j=-\infty}^{j=i} a^{|i-j|} x_j.$$

Figure 2A:
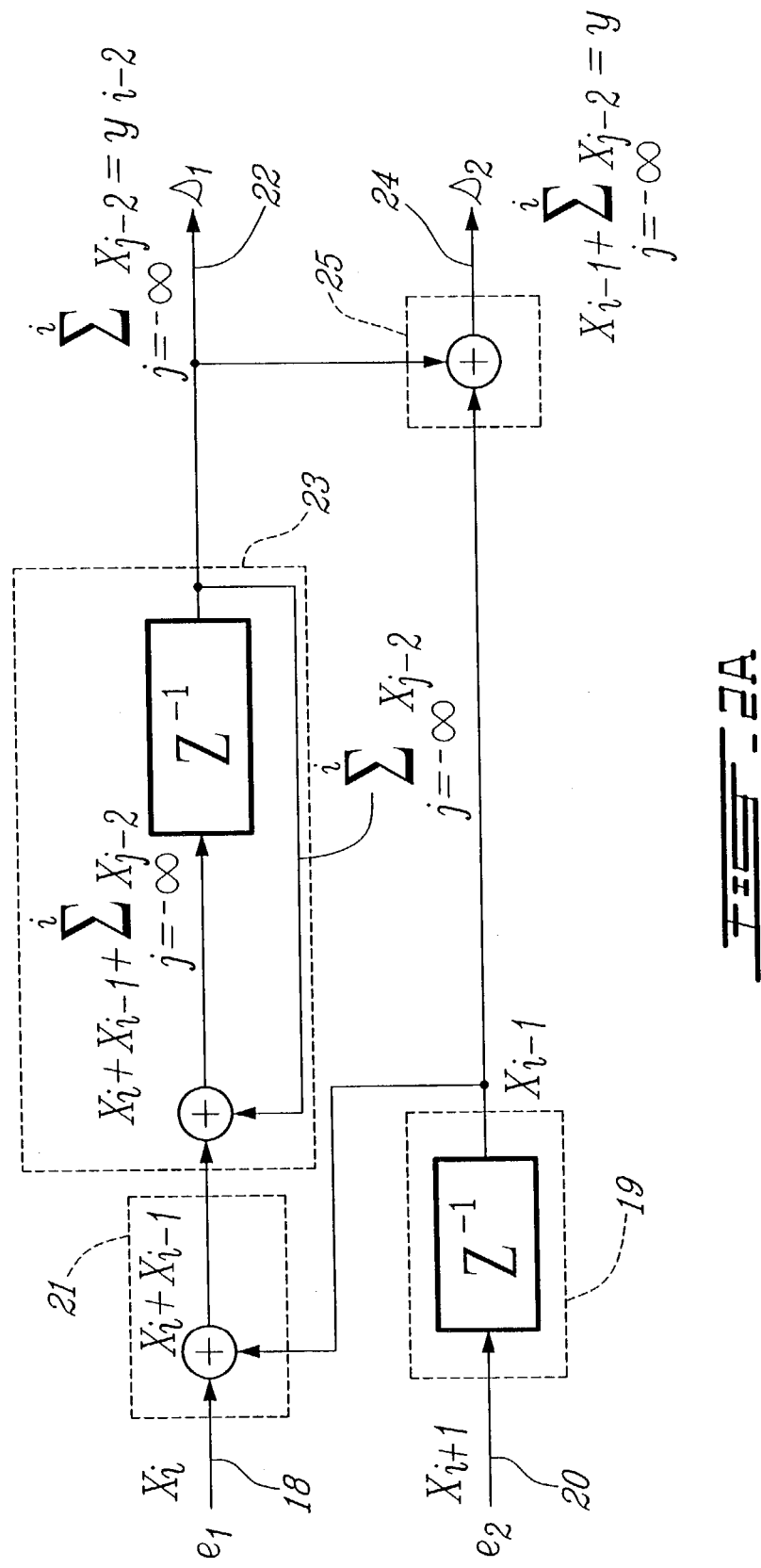
FIG. 2a is a system and signals diagram which shows a first embodiment of the invention; in this first embodiment two input signals $x_i$ and $x_{i+1}$ are provided to a parallelized infinite impulse response filter having a transfer function $y_i/x_i=1/(1-z^{-1})$.

Now referring to FIG. 2a, there is shown one embodiment of the invention. In this embodiment, two input signals $x_i$ and $x_{i+1}$ are provided to a first input 18 and to a second input 20 of a parallelized infinite impulse response filter having a transfer function $y_i/x_i=1/(1-z^{-1})$.

The filter shown in FIG. 2a comprises 4 sections, respectively first section 19, second section 21, third section 23 and fourth section 25.

The section 19 receives the second input signal and provides a delayed signal.

The section 21 receives the first input signal and the delayed signal provided by the first section 19 and add them to provide a second section output signal.

The third section 23 receives the second section output signal and provides an integrated output signal which is the first output signal 22.

The fourth section 25 receives the integrated output signal and the delayed signal and add them to provide a second output signal 24.

It will be appreciated that such filter may be expanded to a filter having a higher number of inputs and a higher number of outputs.

The filter outputs at a first output 22 output signal $y_{i-2}$ and at a second output 24 output signal $y_{i-1}$.

Figure 2B:
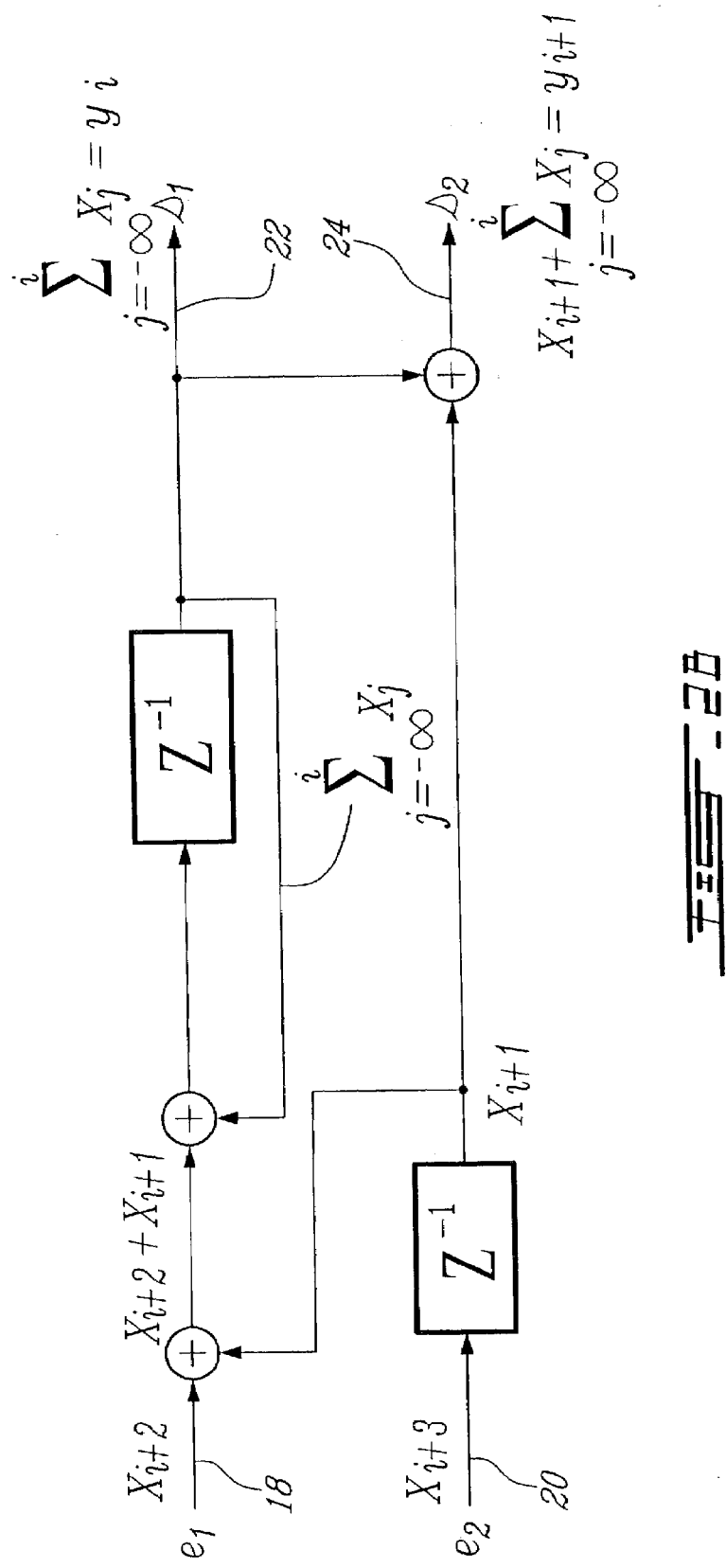
FIG. 2b is a system and signals diagram which shows the first embodiment of the invention, in this embodiment two input signals $x_{i+2}$ and $x_{i+3}$, which are successive in time to input signals $x_i$ and $x_{i+1}$ are provided to a parallelized infinite impulse response filter having a transfer function $y_i/x_i=1/(1-z^{-1})$.

Now referring to FIG. 2b, successive input signals $x_{i+2}$ and $x_{i+3}$ are provided to the first input 18 and to the second input 20 of the parallelized infinite impulse response filter having the transfer function $y_i/x_i=1/(1-z^{-1})$. It will be appreciated that input signals $x_{i+2}$ and $x_{i+3}$ are successive in time to input signals $x_i$ and $x_{i+1}$, shown in FIG. 2a.

The filter outputs at the first output 22 output signal $y_i$ and at a second output 24 output signal $y_{i+1}$.

It will be therefore appreciated that half of input signals $x_i$ are provided to the first input 18 while the other half of the input signals $x_i$ are provided to the second input 20.

Figure 3A:
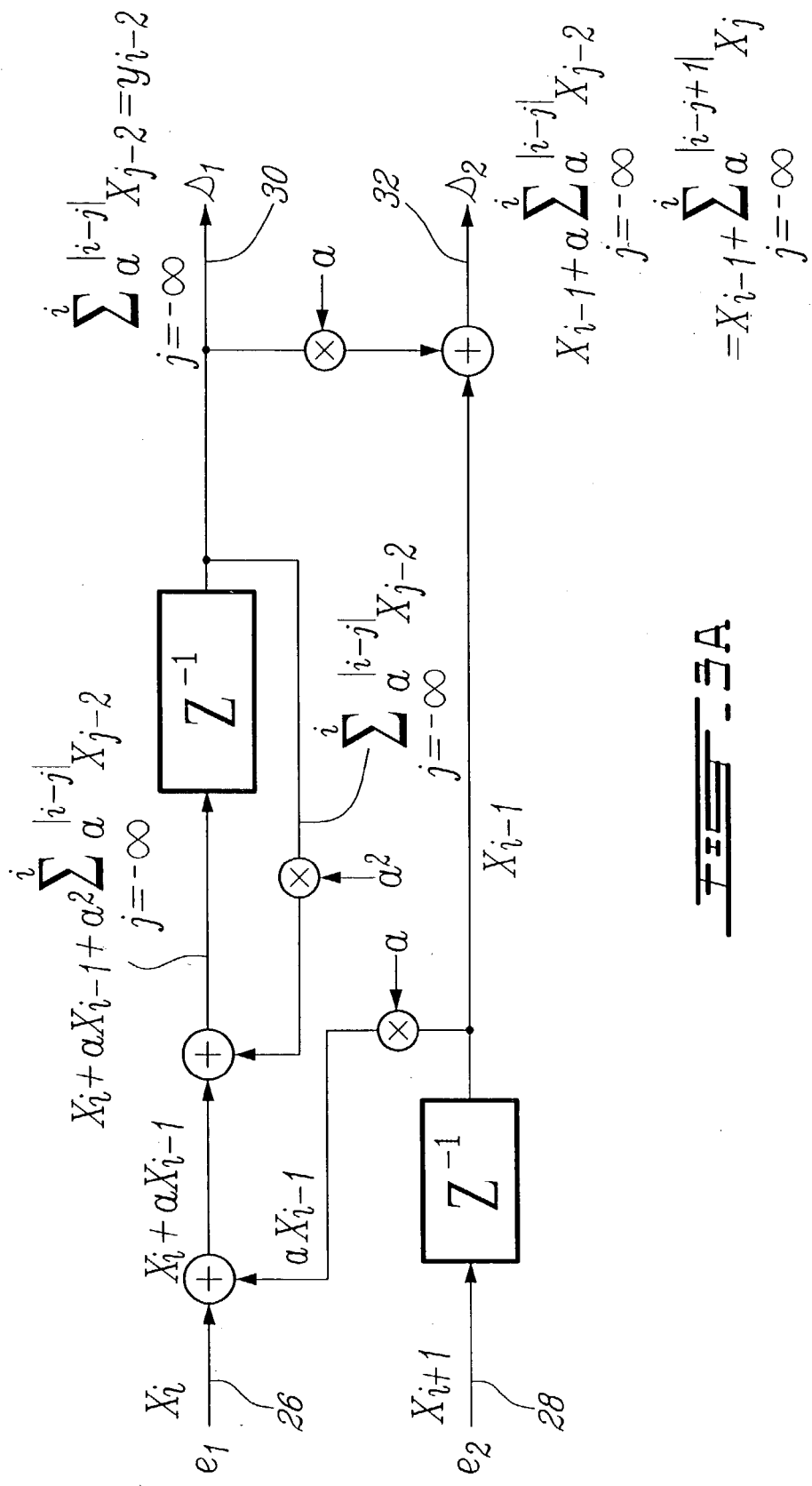
FIG. 3a is a system and signals diagram which shows a second embodiment of the invention; in this embodiment two input signals $x_i$ and $x_{i+1}$ are provided to a parallelized infinite impulse response filter having a transfer function $y_i/x_i=1/(1-az^{-1})$.

Now referring to FIG. 3a, there is shown another embodiment of the invention. In this embodiment, two input signals $x_i$ and $x_{i+1}$ are provided to a first input 26 and to a second input 28 of a parallelized infinite impulse response filter having a transfer function $y_i/x_i=1/(1-az^{-1})$.

The filter outputs at a first output 30 output signal $y_{i-2}$ and at a second output 32, output signal $y_{i-1}$.

Now referring to FIG. 3b, successive input signals $x_{i+2}$ and $x_{i+3}$ are provided to the first input 26 and to the second input 28 of the parallelized infinite impulse response filter having the transfer function $y_i/x_i=1/(1-az^{-1})$.

The filter outputs at the first output 30 output signal $y_i$ and at the second output 32, output signal $y_{i+1}$.

It will be therefore appreciated that half of input signals $x_i$ are provided to the first input 26 while the other half of the input signals $x_i$ are provided to the second input 28. The filter provides half of successive output signals at the first output 30 while the other half of the output signals are provided at the second output 32.

Someone skilled in the art will therefore appreciate that the embodiments described in FIGS. 2a, 2b, 3a, 3b are of great advantage as they achieve parallelization.

Now referring to FIG. 4a, there is shown another embodiment of the invention. In this embodiment of the invention, an integration infinite impulse response filter is provided. The integration infinite impulse response filter has two inputs respectively 40 and 42 and two outputs respectively 44 and 46. The filter further comprises an integration module 80, an adding module 82 and an adding with a delay module 84.

The adding module 82 receives a signal originating from the first input 40 and from the second input 42. The integration module 80 receives an added signal provided by the adding module 82 and provides an integrated signal which is provided to a second output 46. The adding with a delay module 84 adds the second output 46 with the first input 40 to provide a first output 44.

The first input 40 receives a first input digital signal.

The second input 42 receives a second input digital signal successive in time to the first input digital signal provided to the first input 40.

The second output 46 provides a second output digital signal successive in time to a first output digital signal provided by the first output 44.

Now referring to FIG. 4b, there is shown another embodiment of the invention. In this embodiment of the invention, an integration infinite impulse response filter is provided. The integration infinite impulse response filter has three inputs respectively 48, 50 and 52 and three outputs respectively 54, 56 and 58. The filter further comprises an integration module 80, two adding modules 82 and two adding with a delay modules 64 as shown in FIG. 4b.

The first input 48 receives a first input digital signal, while the second input 50 receives a second input digital signal successive in time to the first input digital signal and the third input 52 receives a third input digital signal successive in time to the second input digital signal.

The first output 54 provides a first output digital signal, while the second output 54 provides a second output digital signal successive in time to the first output signal. The third output 58 provides a third output digital signal successive in time to the second output signal provided by the second output 54.

Figure 4C:
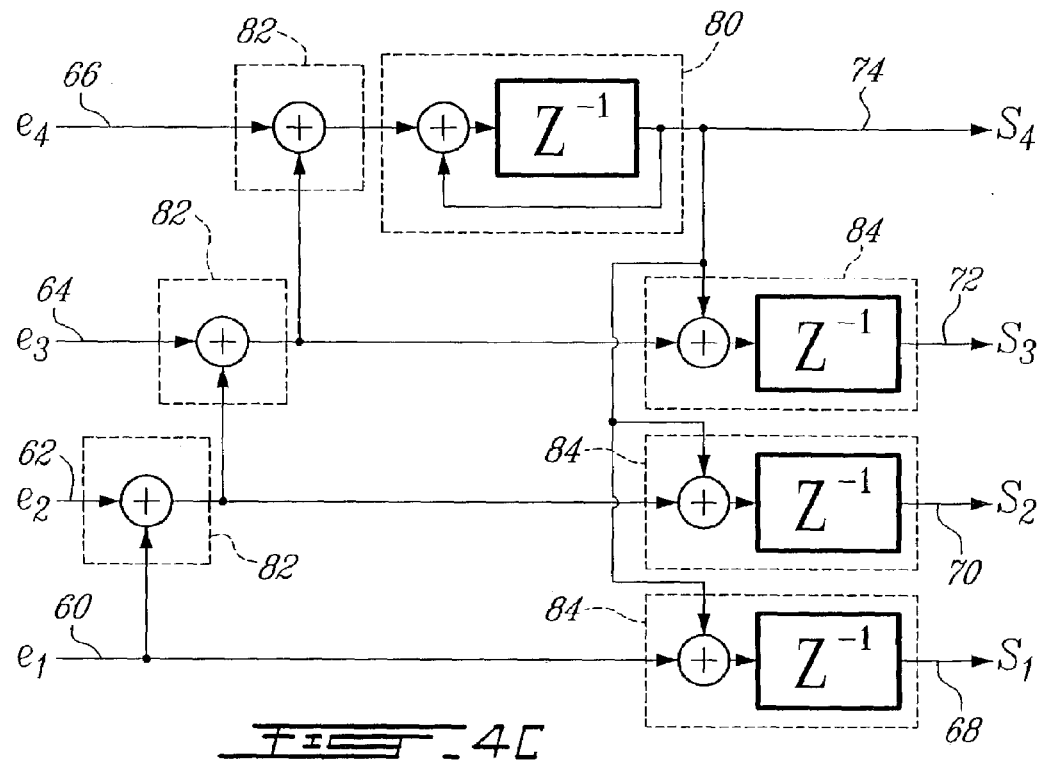
FIG. 4c is a system and signals diagram which shows another embodiment of the invention; in this other embodiment of the invention, an Infinite Impulse Response (IIR) filter which achieves integration is provided having 4 inputs and 4 outputs.

Now referring to FIG. 4c, there is shown another embodiment of the invention. In this embodiment of the invention, an integration infinite impulse response filter is provided. The integration infinite impulse response filter has four inputs respectively 60, 62, 64 and 66 and four outputs respectively 68, 70, 72 and 74. The filter further comprises an integration module 80, three adding modules 82 and three adding with a delay modules 84.

The first input 60 receives a first input digital signal, while the second input 62 receives a second input digital signal successive in time to the first input digital signal, the third input 64 receives a third input digital signal successive in time to the second input digital signal and the fourth input 66 receives a fourth input digital signal successive in time to the third input digital signal.

The first output 68 provides a first output digital signal, while the second output 70 provides a second output digital signal successive in time to the first output signal. The third output 72 provides a third output digital signal successive in time to the second output signal provided by the second output 70. The fourth output 74 provides a fourth output digital signal successive in time to the third output signal provided by the third output 72.

Figure 4D:
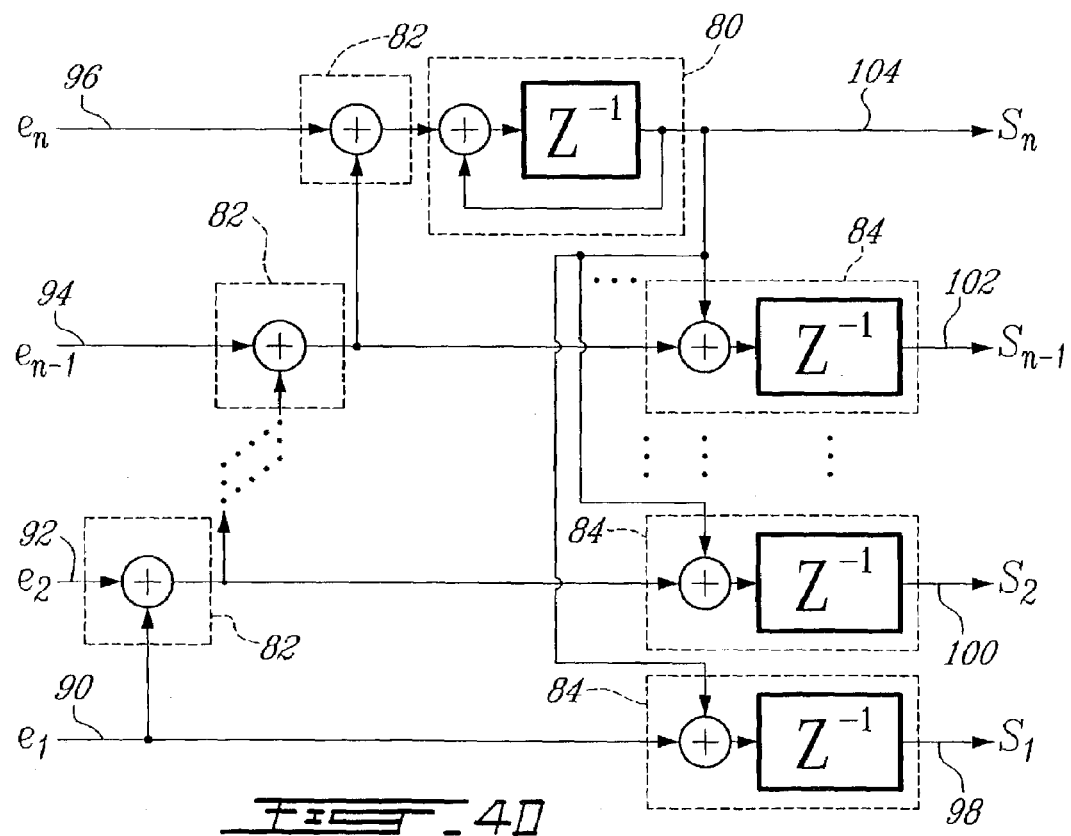
FIG. 4d is a system and signals diagram which shows another embodiment of the invention; in this other embodiment of the invention, an Infinite Impulse Response (IIR) filter which achieves integration is provided having n inputs and n outputs.

Now referring to FIG. 4d, there is shown another embodiment of the invention. In this embodiment of the invention, an integration infinite impulse response filter is provided. The integration infinite impulse response filter has n inputs and n outputs. The filter further comprises an integration module 80, n−1 adding modules 82 and n−1 adding with a delay modules 84.

The first input 90 receives a first input digital signal, while the second input 92 receives a second input digital signal successive in time to the first input digital signal. The n−1 input 94 receives a n−1 input digital signal successive in time to the n−2 input digital signal. The n input 96 receives a n input digital input signal successive in time to the n−1 input digital signal.

The first output 98 provides a first output digital signal, while the second output 100 provides a second output digital signal successive in time to the first output signal. The n−1 output 102 provides a n−1 output digital signal successive in time to the n−2 output digital signal. The n output 104 provides a n output digital signal successive in time to the n−1 output signal provided by the n−1 output 102.

It will be appreciated by someone skilled in the art, that the embodiment shown in FIG. 4d shows a generalization of the embodiments shown respectively in FIGS. 4a, 4b and 4c for respectively n=2, n=3 and n=4.

Figure 5A:
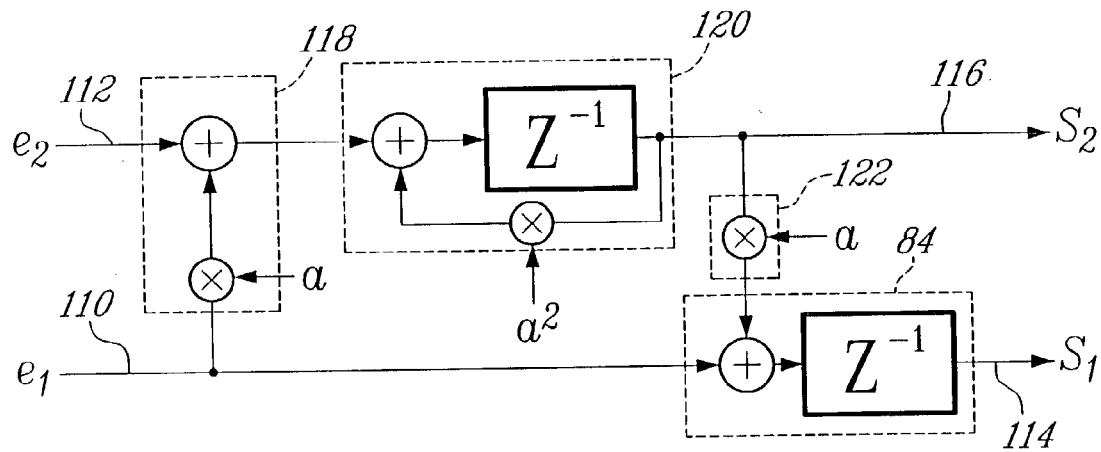
FIG. 5a is a system and signals diagram which shows another embodiment of the invention; in this embodiment of the invention, an Infinite Impulse Response (IIR) filter which achieves an integration coupled with a multiplication is provided having 2 inputs and 2 outputs.

Now referring to FIG. 5a, there is shown an Infinite Impulse Response filter which achieves an integration coupled with a multiplication having 2 inputs and 2 outputs. The integration infinite impulse response filter has two inputs respectively 110 and 112 and two outputs respectively 114 and 116. The filter further comprises an integration module 120, an adding modules coupled with a multiplication by the constant of an input 118, an adding module coupled a delay module 84 and a multiplication module by the constant 122.

The adding modules coupled with a multiplication by the constant of an input 118 receives a signal originating from the first input 110 and from the second input 112. The integration module 120 receives an added signal provided by the adding modules coupled with a multiplication by the constant of an input 118 and provides an integrated signal which is provided to a second output 116. The integrated signal is further multiplied by the constant using the multiplication module 122 and a resulting signal is provided to the adding module coupled a delay module 84. The adding module coupled a delay module 84 further receives the signal originating from the first input 110 and provides a first input 114.

The first input 110 receives a first input digital signal.

The second input 112 receives a second input digital signal successive in time to the first input digital signal provided to the first input 110.

The second output 114 provides a second output digital signal successive in time to a first output digital signal provided by the first output 116.

Figure 5B:
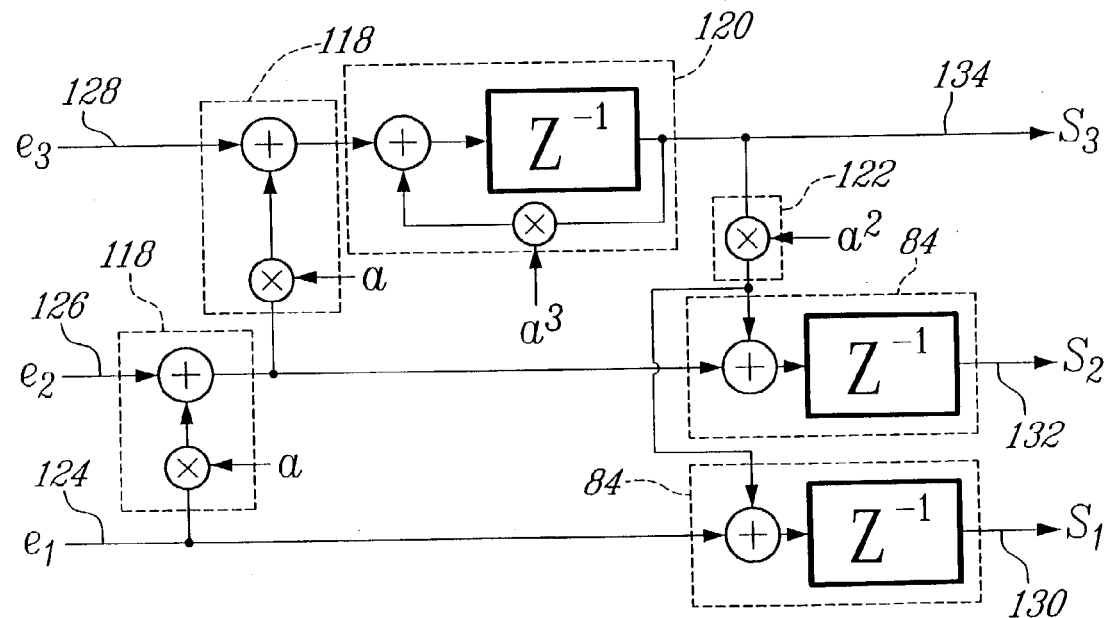
FIG. 5b is a system and signals diagram which shows another embodiment of the invention; in this embodiment of the invention, an Infinite Impulse Response (IIR) filter which achieves an integration coupled with a multiplication is provided having 3 inputs and 3 outputs.

Now referring to FIG. 5b, there is shown an Infinite Impulse Response filter which achieves an integration coupled with a multiplication having 3 inputs and 3 outputs, The integration infinite impulse response filter has three inputs respectively 124, 126 and 128 and three outputs respectively 130, 132 and 134. The filter further comprises an integration module 120, two adding modules coupled with a multiplication by the constant of an input 118 and two adding modules coupled a delay module 84.

The first input 124 receives a first input digital signal, while the second input 126 receives a second input digital signal successive in time to the first input digital signal and the third input 128 receives a third input digital signal successive in time to the second input digital signal.

The first output 130 provides a first output digital signal, while the second output 132 provides a second output digital signal successive in time to the first output signal. The third output 134 provides a third output digital signal successive in time to the second output signal provided by the second output 132.

Figure 5C:
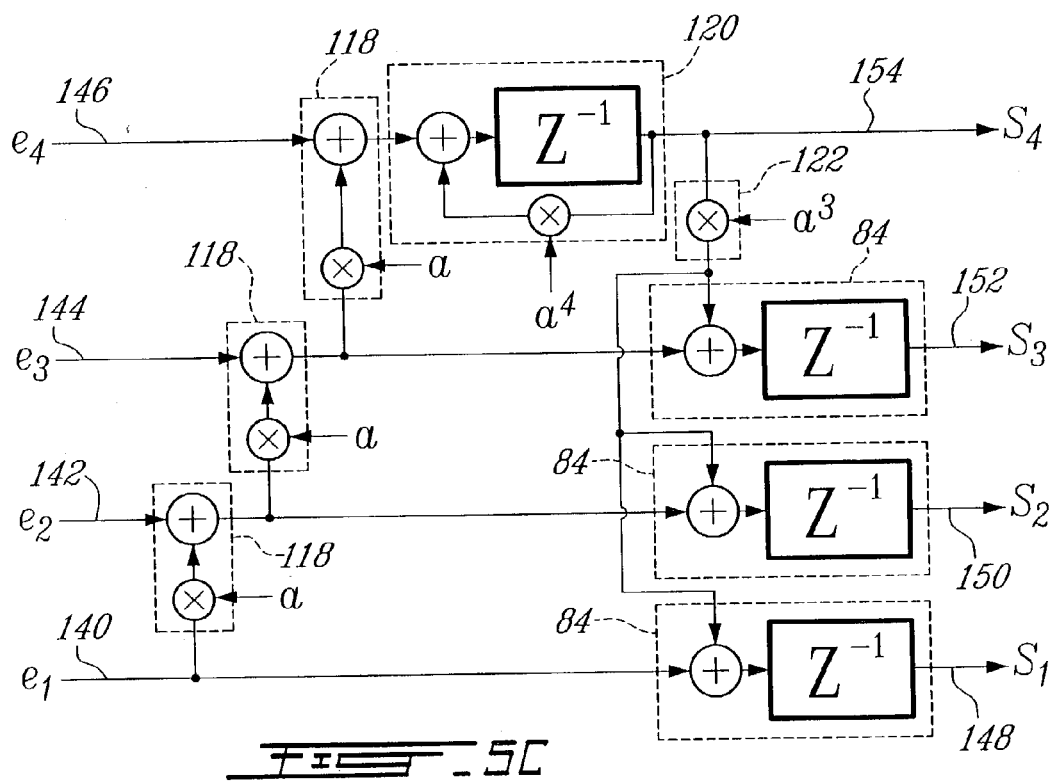
FIG. 5c is a system and signals diagram which shows another embodiment of the invention; in this embodiment of the invention, an Infinite Impulse Response (IIR) filter which achieves an integration coupled with a multiplication is provided having 4 inputs and 4 outputs.

Now referring to FIG. 5c, there is shown an Infinite Impulse Response filter which achieves an integration coupled with a multiplication having 4 inputs and 4 outputs. The integration infinite impulse response filter has four inputs respectively 140, 142, 144 and 146 and four outputs respectively 148, 150, 152 and 154. The filter further comprises an integration module 120, three adding modules coupled with a multiplication by the constant of an input 118 and three adding modules coupled a delay module 84.

The first input 140 receives a first input digital signal, while the second input 112 receives a second input digital signal successive in time to the first input digital signal, the third input 144 receives a third input digital signal successive in time to the second input digital signal and the fourth input 146 receives a fourth input digital signal successive in time to the third input digital signal.

The first output 148 provides a first output digital signal, while the second output 150 provides a second output digital signal successive in time to the first output signal. The third output 152 provides a third output digital signal successive in time to the second output signal provided by the second output 150. The fourth output 154 provides a fourth output digital signal successive in time to the third output signal provided by the third output 152.

Figure 5D:
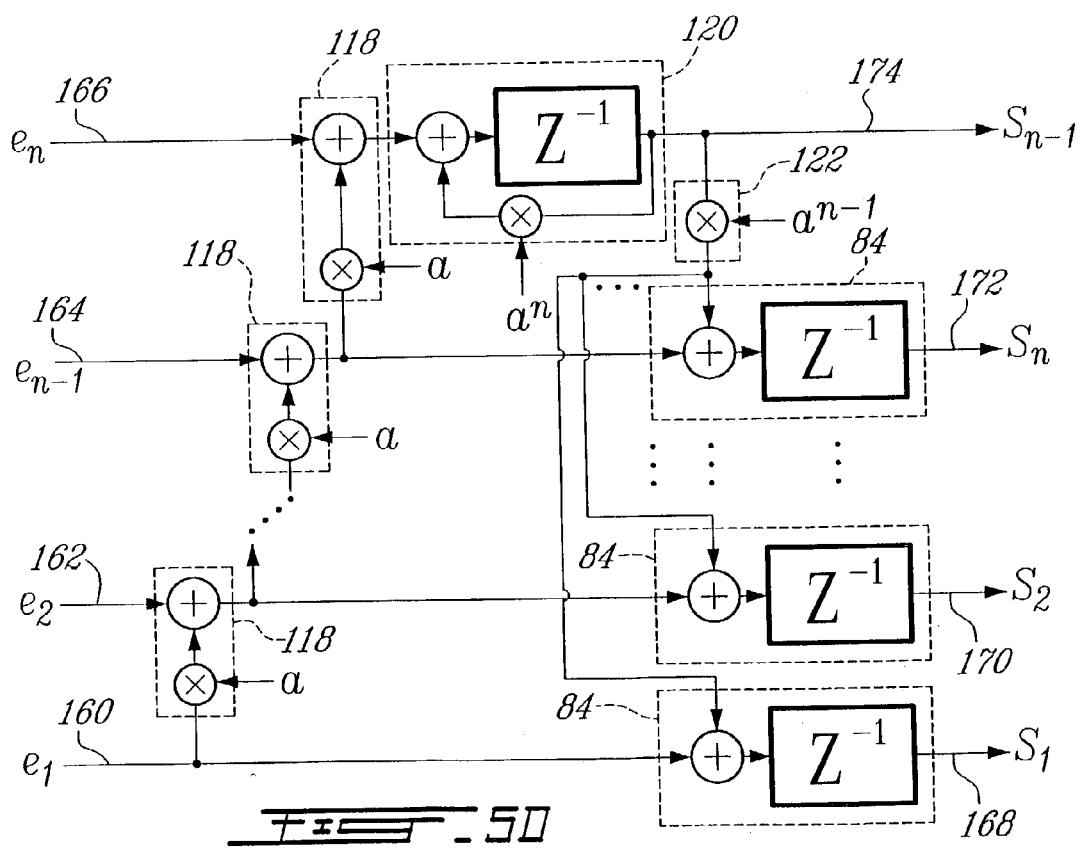
FIG. 5d is a system and signals diagram which shows another embodiment of the invention; in this embodiment of the invention, an Infinite Impulse Response (IIR) filter which achieves an integration coupled with a multiplication is provided having n inputs and n outputs.

Now referring to FIG. 5d, there is shown an Infinite Impulse Response filter which achieves an integration coupled with a multiplication having n inputs and n outputs. The filter further comprises an integration module 120, n−1 adding modules coupled with a multiplication by the constant of an input 118 and n−1 adding modules coupled a delay module 84.

The first input 160 receives a first input digital signal, while the second input 162 receives a second input digital signal successive in time to the first input digital signal. The n−1 input 164 receives a n−1 input digital signal successive in time to the n−2 input digital signal. The n input 166 receives a n input digital input signal successive in time to the n−1 input digital signal, The first output 168 provides a first output digital signal, while the second output 170 provides a second output digital signal successive in time to the first output signal. The n−1 output 172 provides a n−1 output digital signal successive in time to the n−2 output digital signal. The n output 174 provides a n output digital signal successive in time to the n−1 output signal provided by the n−1 output 172.

It will be appreciated by someone skilled in the art, that the embodiment shown in FIG. 5d shows a generalization of the embodiments shown respectively in FIGS. 5a, 5b and 5c for respectively n=2, n=3 and n=4.

Figure 6:
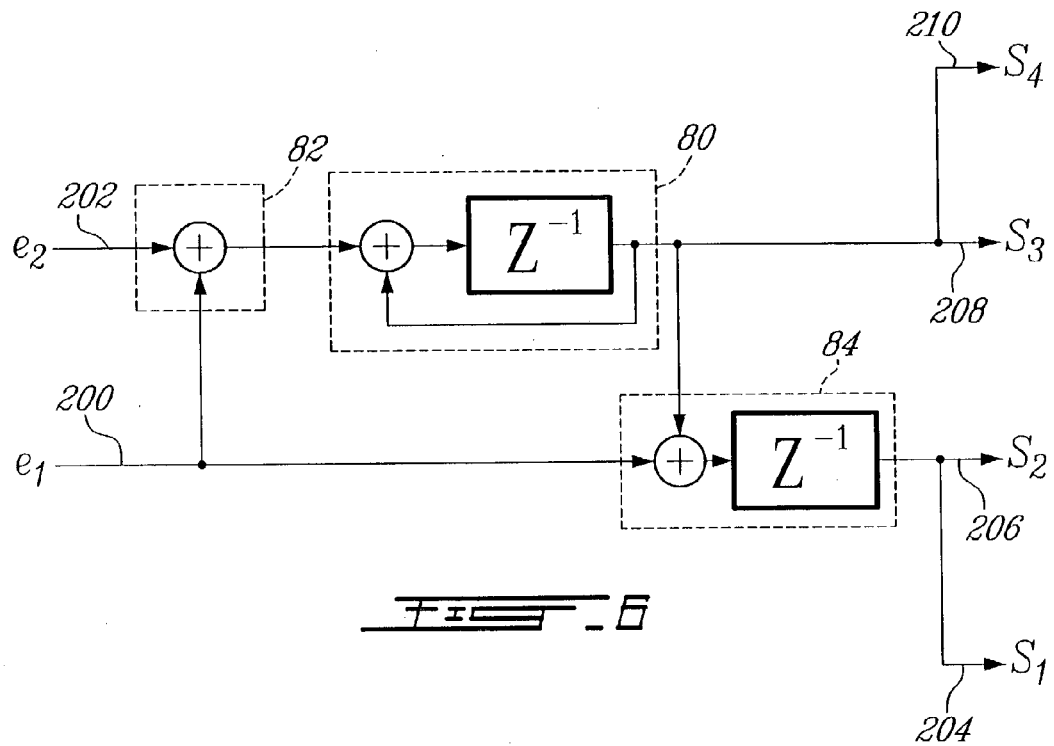
FIG. 6 is a system and signals diagram which shows another embodiment of the invention; in this embodiment of the invention, an Infinite Impulse Response (IIR) filter which achieves integration is provided having 2 inputs and 4 outputs.

Now referring to FIG. 6, there is shown another alternative embodiment of the invention. In this other alternative embodiment, an integration infinite impulse response filter is provided. The integration infinite impulse response filter has two inputs respectively 200 and 202 and four outputs respectively 204, 206, 208 and 210. The filter further comprises an integration module 80, an adding module 82 and an adding with a delay module 84.

The first input 200 receives a first input digital signal.

The second input 202 receives a second input digital signal successive in time to the first input digital signal provided to the first input 200.

It will be appreciated that in this alternative embodiment, the second output 206 provides a second output digital signal which is similar to a first output digital signal provided by the first output 204.

It will further be appreciated that the fourth output 210 provides a fourth output digital signal which is similar to a third digital signal provided by the third output 20B.

The third digital signal is successive in time to the second output digital signal.

It will further be appreciated that the embodiment disclosed in FIG. 4a has been used to create the embodiment disclosed in FIG. 6.

It is therefore similarly possible to build an integration infinite impulse response filter having a number of outputs m lower than the number of inputs n using the embodiment disclosed in FIG. 4d and adding new outputs connected to existing outputs to create such embodiment.

Figure 7:
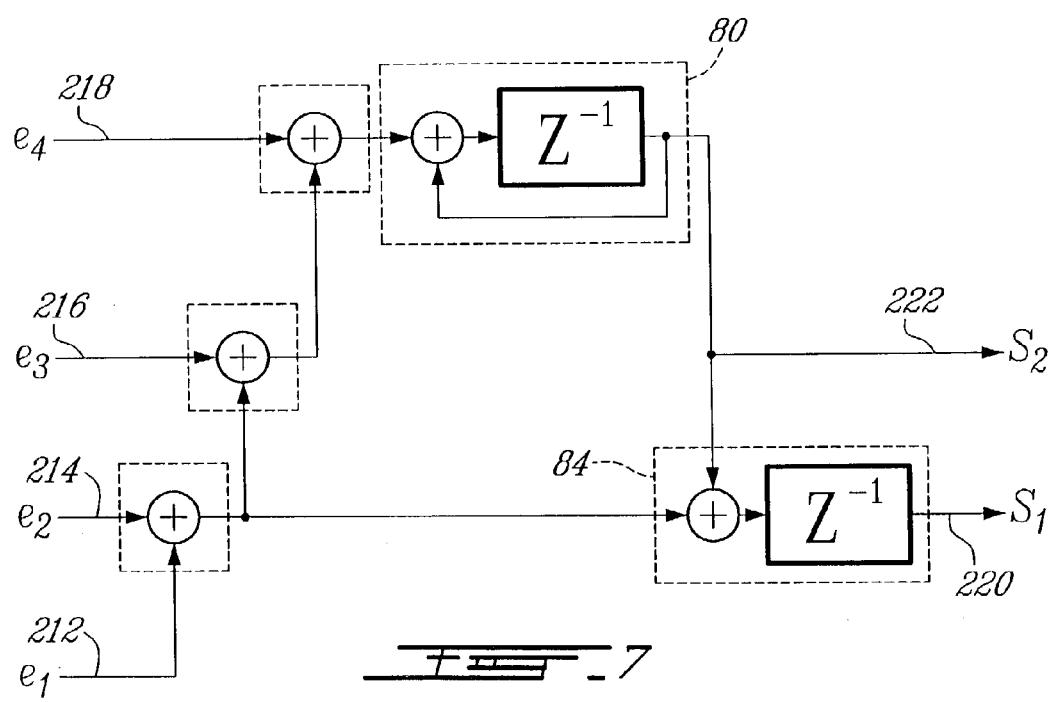
FIG. 7 is a system and signals diagram which shows another embodiment of the invention; in this embodiment of the invention, an Infinite Impulse Response (IIR) filter which achieves integration is provided having 4 inputs and 2 outputs.

Now referring to FIG. 7, there is shown another alternative embodiment.

In this other alternative embodiment, an integration infinite impulse response filter is provided. The integration infinite impulse response filter has four inputs respectively 212, 214, 216 and 218 and two outputs respectively 220 and 222. The filter further comprises an integration module 80, three adding module 82 and an adding with a delay module 84.

The first input 212 receives a first input digital signal.

The second input 214 receives a second input digital signal successive in time to the first input digital signal provided to the first input 212.

The third input 216 receives a third input digital signal successive in time to the second input digital signal provided to the second input 214.

The fourth input 218 receives a fourth input digital signal successive in time to the third input digital signal provided to the third input 216.

The first output 220 provides a first output digital signal, while the second output 222 provides a second output digital signal successive in time to the first output digital signal.

It will be appreciated that this embodiment has be build using advantageously the embodiment shown in FIG. 4C, where the second output 70 and the third output 72 have been cancelled.

It is therefore similarly possible to build an integration infinite impulse response filter having a number of inputs n lower than the number of outputs m using the embodiment disclosed in FIG. 4d and removing outputs connected to existing outputs to create such embodiment.

Figure 8:
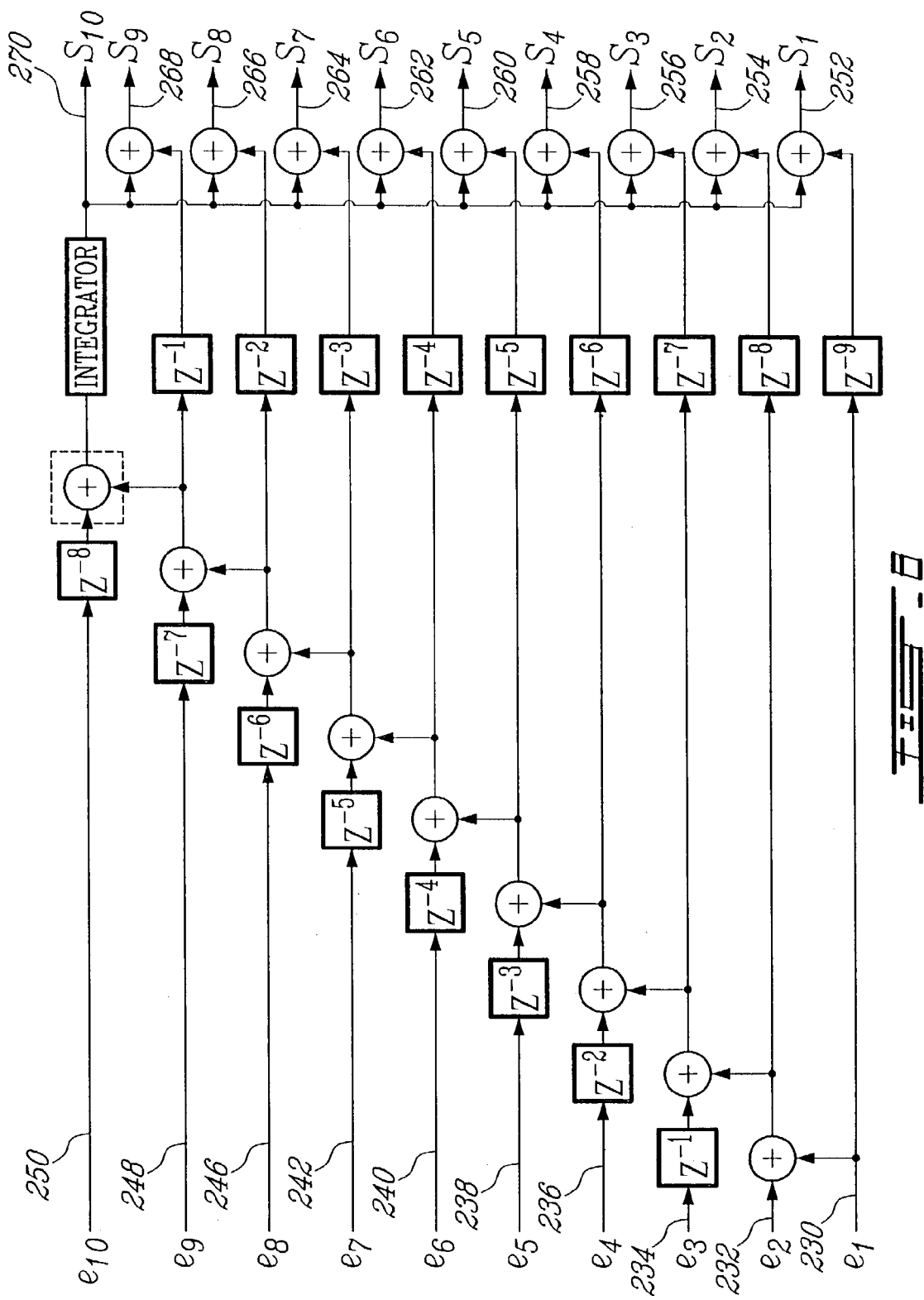
FIG. 8 is a system and signals diagram which shows an embodiment of the invention; in this embodiment of the invention an integration infinite impulse response filter is provided having 10 inputs and 10 outputs.

Now referring to FIG. 8, there is shown an embodiment of the invention for a parallelized integration infinite impulse response filter. In this embodiment, the filter comprises 10 inputs respectively, 230, 232, 234, 236, 238, 240, 242, 244, 246 and 248 and 10 outputs respectively 252, 254, 256, 258, 260, 262, 264, 266, 268, 270.

In this embodiment, input signals $x_i$, $x_{i+11}$ ... $x_{i+n-11}$ are provided to the first input 230.

More precisely, input signals $x_{i+1}$, $x_{i+12}$ ... $x_{i+n-11+1}$ are provided to the second input 232.

Input signals $x_{i+2}$, $x_{i+13}$ ... $x_{i+n-11+2}$ are provided to the third input 234.

Input signals $x_{i+3}$, $x_{i+14}$ ... $x_{i+n-11+3}$ are provided to the fourth input 236.

Input signals $x_{i+4}$, $x_{i+15}$ ... $x_{i+n-11+4}$ are provided to the fifth input 238.

Input signals $x_{i+5}$, $x_{i+16}$ ... $x_{i+n-11+5}$ are provided to the sixth input 240.

Input signals $x_{i+6}$, $x_{i+17}$ ... $x_{i+n-11+6}$ are provided to the seventh input 242.

Input signals $x_{i+7}$, $x_{i+18}$ ... $x_{i+n-11+7}$ are provided to the eight input 244.

Input signals $x_{i+8}$, $x_{i+19}$ ... $x_{i+n-11+8}$ are provided to the ninth input 246.

Input signals $x_{i+9}$, $x_{i+20}$ ... $x_{i+n-11+9}$ are provided to the tenth input 248.

Output signals are sequentially collected at respective outputs 252, 254, 256, 258, 260, 262, 264, 266, 268 and 270.

It will be appreciated by someone skilled in the art that this invention is of great advantage for designing Cascaded Integrate and Comb (CIC) filter as an integrator is used for designing a Cascaded Integrate and Comb filter.

The embodiments of the invention described above are intended to be exemplary only. The scope of the invention is therefore intended to be limited solely by the scope of the appended claims.

We claim:

1. A method for providing a digital parallelized integrator filter, the method comprising the steps of:
   providing a first input digital sample signal to a first adding unit;
   providing a second input digital sample signal, adjacent in time to said first input digital sample signal;
   if said second input digital sample signal follows in time the first input digital sample signal, delaying the second input digital sample signal and adding the delayed second input digital sample signal to said first input digital sample signal to provide an added signal using an adding unit;
   if said second input digital sample signal precedes in time the first input digital sample signal, adding the second input digital sample signal to said first input digital sample signal to provide an added signal using an adding unit;
   integrating said added signal using an integration unit to provide a first output digital sample signal;
   if said second input digital sample signal follows in time the first input digital sample signal, adding the delayed second input digital sample signal to the first output digital sample signal to provide a second output digital sample signal;
   if said second input digital sample signal precedes in time the first input digital sample signal, adding the second input digital sample signal to the first output digital sample signal to provide a second output digital sample signal;
   if said second input digital sample signal precedes in time the first input digital sample signal, delaying the second output digital sample signal to provide the second output digital sample signal;
   wherein the first output digital sample signal is one of an integrated signal of previous digital sample signals following in time the second output digital sample signal, if the first input digital sample signal follows in time the second input digital sample signal and an integrated signal of previous digital sample signals preceding in time the second output digital sample signal, if the first input digital sample signal precedes in time the second input digital sample signal.

2. The method as claimed in claim 1, wherein the adding of the second input digital sample signal to said first input digital sample signal comprises the multiplication of the second input digital sample signal by a constant value; further wherein the integrating of said added signal using an integration unit comprises the multiplication by the constant value squared; further wherein the adding of the second input digital sample signal to the first output digital sample signal comprises the multiplication of the first output digital sample signal by the constant value.

3. The method as claimed in claim 2, wherein the second input digital sample signal precedes in time the first input digital sample signal
   further comprising the step of providing a third input digital sample signal, the third input digital sample signal preceding in time the second input digital sample signal,
   further comprising the step of adding the third input digital sample signal multiplied by the constant value to the second input digital sample signal, using a third adding unit, to provide the second input digital sample signal;
   further comprising the step of adding the third input digital sample signal to the first output digital sample signal multiplied by the constant value squared, using a fourth adding unit, to provide a fourth added signal;
   further comprising the step of delaying the fourth added signal to provide a third output digital sample signal preceding in time the second output digital sample signal;
   further wherein the integrating of said added signal using an integration unit comprises the multiplication by the constant value raised to the third power;
   further wherein the adding of the second input digital sample signal to the first output digital sample signal comprises the multiplication of the first output digital sample signal by the constant value squared.

4. The method as claimed in claim 3, wherein a plurality of digital input samples are added to the digital parallelized integrator filter and a plurality of digital output samples are provided by the digital parallelized integrator filter.

5. The method as claimed in claim 1, wherein the second input digital sample signal precedes in time the first input digital sample signal;
   further comprising the step of providing a third input digital sample signal, the third input digital sample signal preceding in time the second input digital sample signal,
   further comprising the step of adding the third input digital sample signal to the second input digital sample signal, using a third adding unit, to provide the second input digital sample signal;

further comprising the step of adding the third input digital sample signal to the first output digital sample signal, using a fourth adding unit, to provide a fourth added signal;

further comprising the step of delaying the fourth added signal to provide a third output digital sample signal preceding in time the second output digital sample signal.

6. The method as claimed in claim 1, wherein a plurality of digital input samples are added to the digital parallelized integrator filter and a plurality of digital output samples are provided by the digital parallelized integrator filter.

* * * * *